United States Patent
Jones (10) Patent No.: US 11,131,923 B2
(45) Date of Patent: Sep. 28, 2021

(54) SYSTEM AND METHOD OF ASSESSING SURFACE QUALITY BY OPTICALLY ANALYZING DISPENSED DROPS

(71) Applicant: CANON KABUSHIKI KAISHA, Tokyo (JP)

(72) Inventor: Christopher Ellis Jones, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 398 days.

(21) Appl. No.: 16/156,482

(22) Filed: Oct. 10, 2018

(65) Prior Publication Data
US 2020/0117083 A1   Apr. 16, 2020

(51) Int. Cl.
G03F 7/00 (2006.01)
B82Y 30/00 (2011.01)
B82Y 40/00 (2011.01)

(52) U.S. Cl.
CPC ............ *G03F 7/0002* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 5,936,194 A | 8/1999 | Marlow | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 8,485,624 B2 | 7/2013 | Mikami et al. | |
| 8,901,012 B2 | 12/2014 | Hatano et al. | |
| 8,973,494 B2 | 3/2015 | Hatano et al. | |
| 2005/0212178 A1* | 9/2005 | Nien | B82Y 10/00 264/408 |

(Continued)

FOREIGN PATENT DOCUMENTS

| | | |
|---|---|---|
| JP | 2011-222705 A | 11/2011 |
| JP | 2016-004794 A | 1/2016 |

(Continued)

OTHER PUBLICATIONS

Machine translation of JP 2016009798, retrieved from EPO database Jun. 2, 2021 (Year: 2021).*

*Primary Examiner* — Timothy Kennedy
(74) *Attorney, Agent, or Firm* — Daniel Ratoff (57) ABSTRACT

Systems and processes for controlling an imprinting process that dispenses a plurality of droplets onto a substrate. Droplet information representative of droplets is acquired. A set that includes droplet parameters of the droplets based on the droplet information may be estimated. Each of the droplet parameters is representative of particular droplets. Prior to a template being brought into contact with the droplets, either any of the set is outside ranges, or all of the set are inside ranges, may be determined. In a first case when any of the set are outside the ranges, then the imprinting process may be aborted prior to the template being brought into contact with the droplets. In a second case when all of the set are inside the ranges, then the imprinting process may be performed with the template.

20 Claims, 4 Drawing Sheets

(56) References Cited

U.S. PATENT DOCUMENTS

| | | | |
|---|---|---|---|
| 2008/0006604 A1* | 1/2008 | Keady | G02B 6/1225 |
| | | | 216/83 |
| 2009/0243153 A1* | 10/2009 | Sreenivasan | G03F 7/0002 |
| | | | 264/293 |
| 2010/0270705 A1* | 10/2010 | Okushima | G03F 7/0002 |
| | | | 264/293 |
| 2014/0212534 A1 | 7/2014 | Fletcher et al. | |
| 2015/0190961 A1* | 7/2015 | Nakagawa | B29C 59/022 |
| | | | 264/40.5 |
| 2015/0360400 A1 | 12/2015 | Tsurumi | |
| 2016/0129614 A1* | 5/2016 | Yamazaki | B29C 43/58 |
| | | | 264/293 |
| 2016/0271845 A1* | 9/2016 | Yamazaki | G03F 7/0002 |
| 2016/0291486 A1* | 10/2016 | Funayoshi | G03F 7/0002 |
| 2017/0015045 A1* | 1/2017 | Yamaguchi | B05B 1/30 |
| 2017/0263510 A1 | 9/2017 | Baba et al. | |
| 2017/0371240 A1 | 12/2017 | Liu et al. | |

FOREIGN PATENT DOCUMENTS

| | | |
|---|---|---|
| JP | 2016-009798 A | 1/2016 |
| WO | 2018/051960 A | 3/2018 |

\* cited by examiner

SYSTEM AND METHOD OF ASSESSING SURFACE QUALITY BY OPTICALLY ANALYZING DISPENSED DROPS

BACKGROUND

Field of Art

The present disclosure relates to systems and methods of imprinting a pattern on a substrate.

Description of the Related Art

Nano-fabrication includes the fabrication of very small structures that have features on the order of 100 nanometers (nm) or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

In the above-described processes, the formable liquid is deposited onto a coated substrate as a plurality of droplets. If the coating on the substrate is damaged, malformed, or missing, the template can be damaged by the patterning process. The coating is very thin and it is difficult to detect whether the coating on the substrate is damaged, malformed, or missing. What is needed is a method of detecting the coating so as to protect the template while also not slowing down the patterning process.

SUMMARY

At least a first embodiment, may be a process of controlling an imprinting process. The imprinting process may comprise dispensing a plurality of droplets onto a substrate. The imprinting process may further comprise acquiring droplet information that is representative of one or more particular droplets among the plurality of droplets. The imprinting process may further comprise estimating a set that includes one or more droplet parameters of the one or more particular droplets based on the droplet information. Each of the one or more droplet parameters in the set may be representative of a single droplet among the one or more particular droplets. Determining, prior to a template being brought into contact with the plurality of droplets, whether any of the set may be outside one or more ranges, or all of the set may be inside the one or more ranges. In a first case when any of the set are outside one or more ranges, then the imprinting process maybe aborted prior to the template being brought into contact with the plurality of droplets. In a second case when all of the set are inside the one or more ranges, then the imprinting process is performed with the template.

In an aspect of the first embodiment, the droplet information may be an image of the single particular droplet among the one or more particular droplets on the substrate.

In an aspect of the first embodiment, the one or more droplet parameters includes a diameter element that may be an estimated average diameter of the single particular droplet. Also the one or more ranges includes a diameter range that may have a lower bound of 75% of an expected diameter of the single particular droplet and has no upper bound. Also the expected diameter may be estimated based on: a predicted volume of the single particular droplet dispensed onto the substrate; and a period of time between the single particular droplet being dispensed onto the substrate and when the image of the single particular droplet is obtained.

In an aspect of the first embodiment, the droplet information may also be an image representative of multiple droplets among the plurality of droplets.

In an aspect of the first embodiment, the set may also include one or more statistical quantities. Each statistical quantity among the one or more statistical quantities may be representative of a statistical characteristic of the multiple droplets that is calculated based on the droplet parameters in the set. The one or more ranges may be one or more statistical ranges.

In an aspect of the first embodiment, each droplet parameter may include a diameter element that is representative of an estimated average diameter of each droplet among the multiple droplets. Each droplet among the multiple droplets may have an expected diameter. The expected diameter may be estimated based on: a predicted volume of each droplet dispensed onto the substrate; and a period of time between each droplet being dispensed onto the substrate and when the image of each droplet is obtained.

In an aspect of the first embodiment, the one or more droplet parameters may include a plurality of droplet diameter deviations. Each droplet diameter deviation among the plurality droplet diameter deviations is a difference between the expected diameter for each droplet and the diameter element for each droplet. The statistical quantity may be one of an average or median of the plurality of droplet diameter deviations. The statistical range may have a lower bound of 75% of an average expected diameter and has no upper bound.

In an aspect of the first embodiment, the one or more droplet parameters may include a plurality of droplet diameter standard deviations. Each droplet diameter standard deviation among the plurality of droplet diameter standard deviations is a difference between the expected diameter of each droplet and the droplet diameter element for each droplet and the difference divided by the expected diameter of each droplet. The one or more droplet parameters include the plurality of droplet diameter standard deviations. The statistical quantity may be one of an average, median, or standard deviation of the plurality of droplet diameter standard deviations. The statistical range may be ±0.25.

In an aspect of the first embodiment, the one or more droplet parameters may include a plurality of droplet diameter deviations. Each droplet diameter deviation among the plurality of droplet diameter deviations may be a difference between the expected diameter for the each droplet and the diameter element for the each droplet. The statistical quantity may be a standard deviation of the plurality of droplet deviations. The statistical range may be 25%.

In an aspect of the first embodiment, the substrate may include a plurality of imprinting fields. In addition, droplet information about each imprinting field may be acquired prior to each imprinting field being imprinted.

In an aspect of the first embodiment, the droplet information may be one of: a first average intensity of light reflected from a first region where multiple droplets are deposited on the substrate; a first contrast ratio of the light reflected from the first region where the multiple droplets are deposited on the substrate; a second average intensity of light reflected from a second region where the particular droplet is deposited on the substrate; a second contrast ratio of the light reflected from the second region where the particular droplet is deposited on the substrate; and a plurality of pixels, wherein each pixel among the plurality of pixels represents a portion of the light reflected from the region where the particular droplet is deposited on the substrate.

In an aspect of the first embodiment, the each of the one or more droplet parameters of the particular droplet is representative of: an estimated length of a first chord passing through a predicted center of the particular droplet along a first direction; an estimated length of a second chord passing through an estimated center of the droplet in the first direction; an estimated length of a third chord passing connecting two points on an estimated edges of the particular droplet; an estimated diameter of the particular droplet; an estimated radius of the particular droplet; an estimated eccentricity of the particular droplet; an estimated roundness of the particular droplet; an estimated compactness of the particular droplet; an estimated circumference of the particular droplet; an estimated area of the particular droplet; and an isoperimetric ratio of the particular droplet as estimated by the square of the estimated circumference of the particular droplet divided by the estimated area of the particular droplet.

In an aspect of the first embodiment, the substrate may include a plurality of imprinting fields. In addition, droplet information about one imprinting field among the plurality of imprinting fields may be acquired prior to imprinting any of the plurality of imprinting fields. Furthermore, droplet information about the plurality of imprinting fields other than the one imprinting field is not acquired.

In an aspect of the first embodiment, a particular physical characteristic of the particular droplet that is represented by a particular droplet parameter among the one or more droplet parameters may be selected from: a diameter difference between an estimated average droplet diameter of the particular droplet and an expected droplet diameter of the particular droplet; a general absolute position difference between an estimated general coordinate position of the particular droplet and an expected general coordinate position of the particular droplet; a first coordinate position difference between an estimated first coordinate position of the particular droplet along a first axis and an expected first coordinate position of the particular droplet along the first axis; a second coordinate position difference between an estimated second coordinate position of the particular droplet along a second axis and an expected second coordinate position of the particular droplet along the second axis, wherein the second axis is perpendicular to the first axis; a radius difference between an estimated radius of the particular droplet and a predicted radius of the particular droplet; an eccentricity difference between an estimated eccentricity of the particular droplet and a predicted eccentricity of the particular droplet; a roundness difference between an estimated roundness of the particular droplet and a predicted roundness of the particular droplet; a compactness difference between an estimated compactness of the particular droplet and a predicted compactness of the particular droplet; a circumference difference between an estimated circumference of the particular droplet and a predicted circumference of the particular droplet; an area difference between an estimated area of the particular droplet and a predicted area of the particular droplet; and an isoperimetric ratio difference between an estimated isoperimetric ratio of the particular droplet as estimated by the square of the estimated circumference of the particular droplet divided by the estimated area of the particular droplet, and a predicted isoperimetric ratio of the particular droplet.

In an aspect of the first embodiment, the droplet information may be an image obtained by an imaging device that obtains light from the particular droplet that has passed through the template prior to the template being brought into contact with the plurality of droplets.

In an aspect of the first embodiment, the image is obtained prior to the template and the substrate moving towards each other.

In an aspect of the first embodiment, the image may be obtained while the template and the particular droplet are moving relative to each other in a direction that includes moving in a direction parallel with the substrate.

In an aspect of the first embodiment, the droplet information may be an image obtained by an imaging device that obtains light from the particular droplet prior to the template being brought into superposition with the plurality of droplets.

At least a second embodiment, may be an imprinting apparatus that forms a pattern on a substrate using a template. The imprinting apparatus may comprise a substrate holder configured to hold the substrate. The imprinting apparatus may further comprise a dispenser configured to dispense a plurality of droplets onto the substrate. The imprinting apparatus may further comprise an imaging system configured to acquire droplet information that is representative of one or more particular droplets among the plurality of droplets. The imprinting apparatus may further comprise a processor configured to estimate a set that includes one or more droplet parameters of the one or more particular droplets based on the droplet information. Each of the one or more droplet parameters in the set may be representative of a single droplet among the one or more particular droplets. The processor may be further configured to, prior to a template being brought into contact with the plurality of droplets, determining whether any of the set are outside one or more ranges, or all of the set are inside the one or more ranges. In a first case when any of the set are outside one or more ranges, then the processor may be configured to send instructions to abort an imprinting process prior to the template being brought into contact with the plurality of droplets. In a second case when all of the set are inside the one or more ranges, then the processor may send instructions to perform the imprinting process with the template.

At least a third embodiment, may be a method of manufacturing an article. The method may comprise dispensing a plurality of droplets of formable material onto a substrate. The method may further comprise acquiring droplet information that is representative of one or more particular droplets among the plurality of droplets. The method may further comprise estimating a set that includes one or more droplet parameters of the one or more particular droplets based on the droplet information. Each of the one or more droplet parameters in the set may be representative of a single droplet among the one or more particular droplets. The method may further comprise determining, prior to a template being brought into contact with the plurality of droplets, whether any of the set are outside one or more ranges, or all of the set are inside the one or more ranges. In a first case when any of the set are outside one or more ranges, then an imprinting process may be aborted prior to the template being brought into contact with the plurality of droplets. In a second case when all of the set are inside the one or more ranges, then the imprinting process may be performed by contacting the formable material on the substrate with the template, forming a pattern in the formable material on the substrate. The method may further comprise processing the substrate on which the pattern has been formed, wherein the article is manufactured from the processed substrate.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Imprinting can be performed on substrates with very thin coatings (1-5 nm). If a substrate has a coating that is missing or malformed the template used for imprinting can be damaged. Methods for assessing the presence or quality of a very thin coating on a substrate are time intensive (on the order of a minute), expensive, and/or are not suitable for in-line analysis for high volume manufacturing on anything other than a statistical basis. What is needed is a system and/or method that can assess the presence and/or quality of a very thin film on a substrate without adding significant cost or time to the imprinting process and can be used for every substrate.

Nanoimprint System

Figure 1:
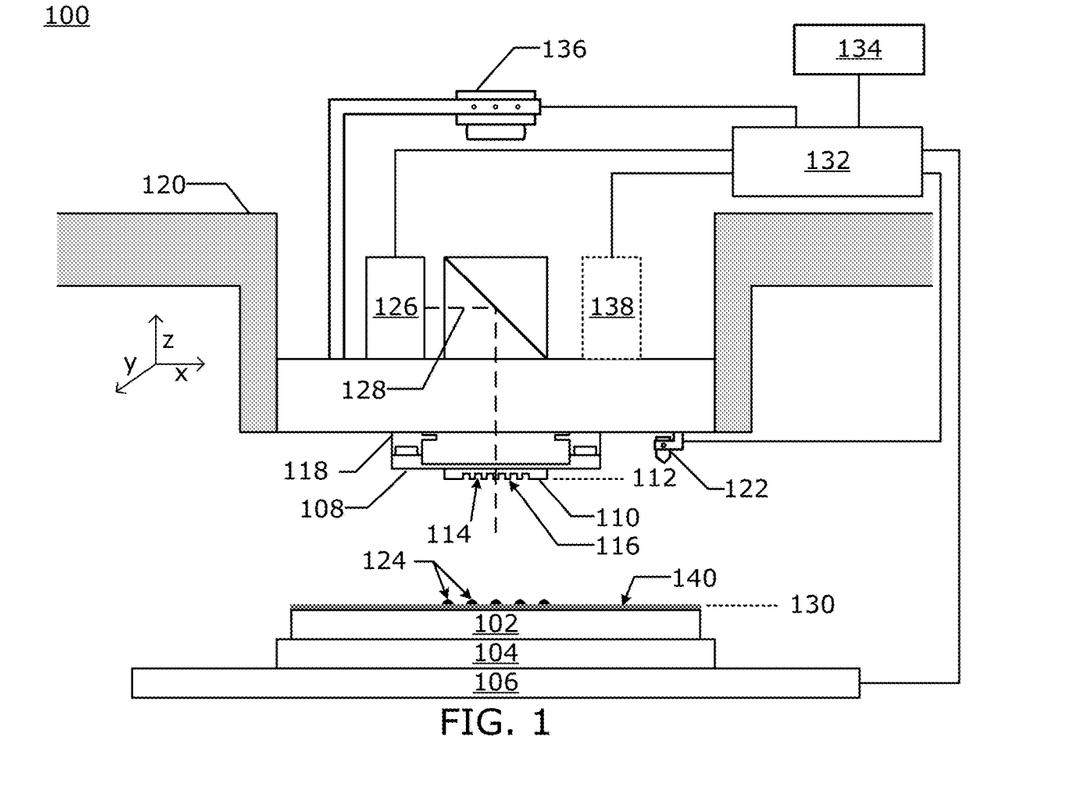
FIG. 1 is an illustration of an exemplary nanoimprint lithography system having a template with a mesa spaced apart from a substrate as used in an embodiment.

FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques such as drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The imprint head and the substrate positioning stage 106 may be configured to position the template 108 and the substrate 102 in superimposition with the exposure path 128. A spread camera 136 may likewise be positioned such that an imaging field of the spread camera 136 is in superimposition with the exposure path 128. The spread camera 136 may be configured to detect the spread of formable material under the template 108.

The nanoimprint lithography system 100 may further comprise an droplet inspection system 138 that is separate from the spread camera 136. The droplet inspection system 138 may include one or more of a CCD, a camera, a line camera, and/or a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

Prior to the formable material 124 being dispensed onto the substrate, a coating 140 is applied to the substrate 102. In an embodiment, the coating 140 is an adhesion layer. In an embodiment, the coating 140 is applied to the substrate 102 prior to the substrate being loaded onto the substrate chuck 104. In an alternative embodiment, the coating 140 is applied to substrate 102 while the substrate 102 is on the substrate chuck 104. In an embodiment, the coating 140 is applied by spin coating, dip coating, etc. In an embodiment, the substrate 102 is a semiconductor wafer. In another embodiment, the substrate 102 is a blank template (replica blank) that is used to create a daughter template after being imprinted.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, the spread camera 136 and/or the droplet inspection system 138. The processor 132 may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled with the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to cure, solidify, and/or cross-link conforming to a shape of the substrate surface 130 and the patterning surface 112, defining a patterned layer on the substrate 102. The formable material 124 is cured while the template 108 is in contact with formable material 124, forming the patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprinting fields that are spread across the substrate surface 130. Each of the imprinting fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprinting field which is the same size as the substrate 102 or the area of the substrate 102 which is to be patterned with the mesa 110. In an alternative embodiment, the imprinting fields overlap. Some of the imprinting fields may be partial imprinting fields which intersect with a boundary of the substrate 102.

The patterned layer may be formed such that it has a residual layer having a residual layer thickness (RLT) above a highest point on the substrate surface 130 in each imprinting field. The patterned layer may also include one or more features such as protrusions which extend above the residual layer having a thickness. These protrusions match the recesses 114 in the mesa 110.

Coating Inspection

The substrate 102 may be a wafer or a template replica blank. The applicant has found that it is advantageous to apply a coating 140 prior to imprinting. The coating 140 may provide multiple functions. In an embodiment, the coating 140 may be an adhesion coating. In an embodiment, the coating 140 may reduce the contact angle of formable material 124 droplets. Reducing the contact angle increases the speed at which formable material 124 spreads prior to the patterning surface 112 contacting the formable material 124. Increasing the speed at which the formable material 124 spreads increases the overall throughput. In an embodiment, the coating 140 may provide improved adhesion of the formable material 124 to the substrate after it is cured. Improving the adhesion helps to ensure that the formable material 124 stays attached to the substrate 102 and does not contaminate the template 108. In an embodiment, the coating 140 may protect the substrate 102 and template 108 from damaging each other.

If the coating 140 is missing or malformed due to a coating process error, it can lead to increased defectivity in the resulting imprint pattern and contaminate the template 108. The coating 140 may be very thin and it can be difficult to assess the quality and/or presence of the coating 140 without adversely affecting the coating 140. In an embodiment, the coating 140 may have a thickness of 1-5 nm.

During the imprinting process, formable material 124 may be deposited onto the substrate as a plurality of droplets 124. The applicant has found that if these droplets are inspected at a specific time after they are deposited and prior to the patterning surface 112 contacting the formable material 124, then the presence and quality of the coating 140 can be determined. In an embodiment, the droplets 124 are inspected 2000, 1000, 500, 100, 50, 10, or 1 milliseconds (ms) after being deposited onto the substrate 102.

An optical system such as droplet inspection system 138 or the spread camera 136 may be used to inspect the droplets 124. The droplet inspection system 138 or the spread camera 136 may obtain images of one or more droplets of formable material 124 on the substrate 102, which may be stored in memory 134. Different portions of an image may be obtained at different times depending on the scan rate of the image sensor. Thus a portion of the image associated with each droplet may be obtained at different times. The processor 132 may be used to inspect the shape and diameter of the droplets of formable material 124 at a specified time. In an embodiment, the droplets are deposited at specified positions with high accuracy. The processor 132 may use image processing technique to measure a droplet parameter associated with a particular droplet. Each droplet parameter may represent a specific physical characteristic of a particular droplet. For example a droplet parameter may represent a diameter of a particular droplet. A statistical quantity may also be determined based upon multiple droplets parameters, for example the average diameter of multiple droplets. The processor 132 may also be used to identify a missing droplet due to a clogged nozzle. The processor 132 may also be used to identify a deviated droplet due to a partially clogged nozzle. A single image may include one droplet or multiple droplets among the plurality of droplets. The processor 132 may be used to obtain droplet information as an image obtained by an imaging device such as the spread camera 136 that obtains light from the particular droplet that has passed through the template 108 prior to the template 108 being brought into contact with the plurality of droplets of formable material 124.

Examples of potential droplet parameters that may be used in an embodiment are: an estimated length of a first chord passing through a predicted center of the particular droplet along a first direction; an estimated length of a second chord passing through an estimated center of the droplet in the first direction; an estimated length of a third chord passing connecting two points on an estimated edges of the particular droplet; an estimated diameter of the particular droplet; an estimated radius of the particular droplet; an estimated eccentricity of the particular droplet; an estimated roundness of the particular droplet; an estimated compactness of the particular droplet; an estimated circumference of the particular droplet; an estimated area of the particular droplet; and an isoperimetric ratio of the particular droplet as estimated by the square of the estimated circumference of the particular droplet divided by the estimated area of the particular droplet. When the droplet is initially deposited it may initially have a round shape, which becomes less round as it spreads due to the topography of the substrate 102 and/or interactions with coating 140. For example, the droplet may develop fingers that extend outward faster than the droplet as whole spreads. In an embodiment, a potential droplet parameter may be an estimated length of a chord between two points on an edge of an image droplet that is aligned with a scanning direction of an image sensor.

The applicant has found that a substrate 102 with a properly formed coating 140 will exhibit large diameter droplets of dispensed formable material 124 that have an average diameter that is highly repeatable. However, when the coating 140 is missing, then the applicant has found that dispensed droplets of formable material have a significantly smaller drop diameter due to the difference in the wettability of the coated substrate versus the wettability of uncoated substrate.

The applicant has also found that when the coating 140 is malformed (a non-limiting example of a malformed coating 140 is a film with a non-uniform thickness), then the variation in the drop size and/or shape (i.e. any of the various droplet parameters) of the formable material droplets increases.

In an exemplary embodiment, a plurality of droplets of formable material 124 are deposited onto a coated substrate. When a small droplet (less than 10 pL) of formable material 124 initially lands on a substrate 102, the size and/or shape of the droplet may vary dramatically during the first ms or so of the droplet landing on the substrate in a non-monotonic manner. For example, during the first ms, the droplet may bounce, spread out, split, shrink in diameter while becoming taller, etc. The dynamics of the droplet, when it initially lands, and the behavior of the droplet are governed by the landing velocity, the volume, the topography, etc. After the initial landing period (1-2 ms for example), the landing energy dissipates, and the wetting angle of the droplet with the surface starts to have a larger impact on the spreading of the droplet. The applicant has found that average drop diameter of droplets on a coated substrate is 80 µm after 10 ms. The applicant has also found that the average drop diameter of those same droplets on an uncoated substrate is 60 µm after 10 ms. In an embodiment, the average drop diameter is estimated based on an optical observation of the droplets on the substrate 102. If the optical observation determines that there is 25% reduction in drop diameter, then the imprinting process can be aborted. By aborting the imprinting process, the template 108 and/or the substrate 102 can be protected from an inadvertent missing or malformed coating 140.

A processor 132 in combination with an optical system such as the spread camera 136 or the droplet inspection system 138 can obtain and analyze images of droplets on the substrate 102. Based on this analysis, the surface condition of the substrate 102 can be determined prior to the patterning surface 112 contacting the formable material. This helps reduce defectivity and detect errors early in the imprinting process while also preventing damage to the template 108.

Imprinting Process

Figure 2:
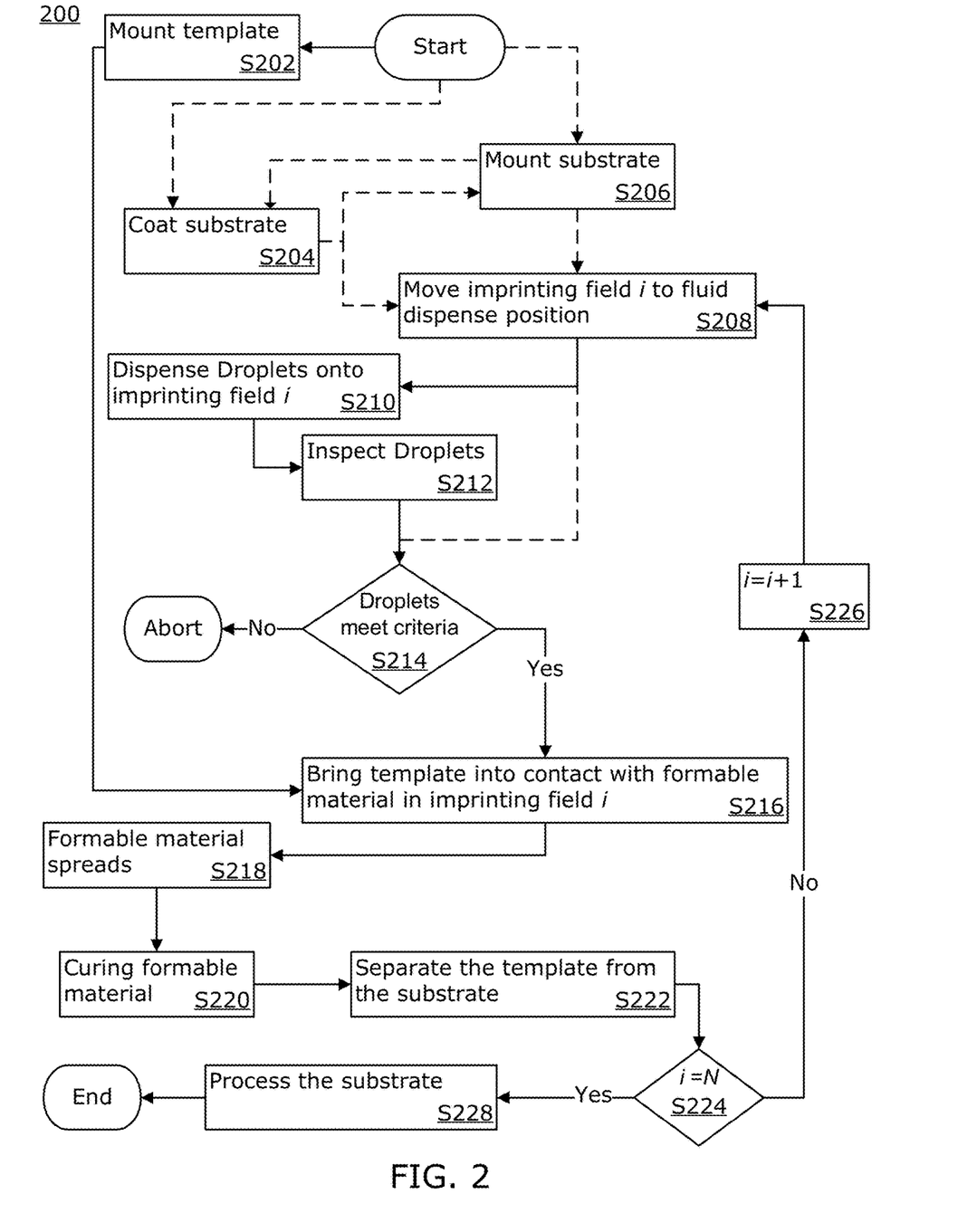
FIG. 2 is an illustration of an exemplary imprinting method as used in an embodiment.

FIG. 2 is a flowchart of an imprinting process 200 by the nanoimprint lithography system 100 that can be used to form patterns in formable material 124 on a plurality of substrate-side imprinting fields (also referred to as: pattern areas or shot areas). The optional nature of the order of the steps in process 200 is illustrated with arrows with dashed lines. The imprinting process 200 may be performed repeatedly on a plurality of substrates 102 by the nanoimprint lithography system 100. The processor 132 may be used to control imprinting process 200.

The beginning of the imprinting process 200 may include a template mounting step S202 of the processor 132 causing a template conveyance mechanism to mount a template 108 onto the template chuck 118. The imprinting process 200 may also include a coating step S204 of applying a coating 140 to the substrate 102. The coating step S204 may be performed prior to the substrate 102 being loaded into the nanoimprint lithography system 100. In an embodiment, the coating 140 is applied by spin coating, dip coating, etc, and the coated substrate is then loaded into a cassette including a plurality of coated substrates. In an alternative embodiment, the nanoimprint lithography system 100 coats the substrate. The coating step S204 may be performed prior to, subsequently, or simultaneously with step S202.

In a substrate mounting step S206, the processor 132 causes a substrate conveyance mechanism to mount the substrate 102 onto the substrate chuck 104. The order in which the template 108 and the substrate 102 are mounted onto the nanoimprint lithography system 100 imprint apparatus is not particularly limited, and the template 108 and the substrate 102 may be mounted sequentially or simultaneously. In an embodiment, in which the nanoimprint lithography system 100 does not coat the substrate, a substrate 102 with a coating 140 is loaded onto to the substrate chuck 104.

In a positioning step S208, the processor 132 may cause one or both of the substrate positioning stage 106 and a dispenser positioning stage (not shown, which may also move the template) to move an imprinting field i (index i may be initially set to 1) of the substrate 102 to a fluid dispense position below the fluid dispenser 122. The substrate 102 may be divided into N imprinting fields, wherein each imprinting field is identified by an index i. In a dispensing step S210, the processor 132 may cause the fluid dispenser 122 to dispense a plurality of droplets of formable material 124 onto an imprinting field i of the substrate. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprinting field i may be moved relative to the fluid dispenser 122 while the fluid dispenser is ejecting formable material 124. Thus, the time at which some of the droplets land on the substrate may vary across the imprinting field i.

The imprinting process 200 includes a droplet inspection step S212. The droplet inspection step S212 includes acquiring droplet information that is representative of a particular droplet among the plurality of droplets. The droplet inspection step S212 may also include the inspection of one or more of the droplets dispensed in step S210 and estimating a set that includes one or more droplet parameters based on this inspection. Each droplet parameter in the set may be representative of physical characteristics of a single droplet among the multiple droplets. The set of one or more droplet parameters may include multiple droplet parameters associated with a single droplet among the plurality of droplets. For example, the set may include a diameter parameter and a position parameter for each single droplet among the multiple droplets. The inspection of the droplets may be performed with a dedicated droplet inspection system 138 or with the spread camera 136. In an embodiment, one or both of the dedicated droplet inspection system 138 and the spread camera 136 may be used to acquire an image of the particular droplet on the substrate prior to the template 108 contacting the plurality of droplets of formable material 124. The image may also include multiple droplets among the plurality of droplets dispensed onto the substrate 102. The set may also include statistical quantities that are determined based upon multiple droplet parameters that are representative of a physical characteristic of multiple droplets. One or both of the dedicated droplet inspection system 138 and the spread camera 136 may be configured to obtain an image from a subset of the pixels available when obtaining the droplet information. The image may be obtained at a set time measured from when the droplet is ejected from the dispenser or when the droplet lands on the substrate. The set time may be 1.0, 0.5, 0.1, 0.05, 0.01, or 0.001 seconds. The set time may be determined by how much the droplets spread when they land on a properly coated substrate versus how much they spread on a malformed surface or an uncoated substrate. The set time is limited between the time allotted for dispensing, time at which the template contacts the droplets, and the time required to abort the imprinting process (100-500 ms). This allotted time is kept short to keep the imprinting throughput high. The inspection step S212 may begin while step S210 is still being performed or after step S210 has finished.

In an embodiment, the droplet information acquired during inspection step S212 is one or more of several types of information such as a digital image, an analog signal, an analog value, and/or a digital value. In an embodiment, the droplet information includes a first average intensity of light reflected from a first region where multiple droplets are deposited on the substrate. In an embodiment, the droplet information includes a first contrast ratio of the light reflected from the first region where the multiple droplets are deposited on the substrate. In an embodiment, the droplet information includes a second average intensity of light reflected from a second region where the particular droplet is deposited on the substrate. In an embodiment, the droplet information includes a second contrast ratio of the light reflected from the second region where the particular droplet is deposited on the substrate. In an embodiment, the droplet information includes a plurality of pixels, wherein each pixel among the plurality of pixels represents a portion of the light reflected from the region where the particular droplet is deposited on the substrate.

After or while the droplet inspection step S212 is being performed, the processor 132 may check if estimated droplet parameters meet certain criteria in a criteria check step S214. The criteria check step S214 also includes estimating a droplet parameter of the particular droplet based on the droplet information obtained in the inspection step S212. A set may be formed that includes one or more droplet parameters. Each droplet parameter in the set may be representative of the particular droplet, an aspect of the particular droplet, and/or a physical characteristic of the particular droplet. Step S214 may include checking if one or more of the droplet parameters in the set are within a range of expected values. Step S214 may also include checking if a statistical quantity of the droplet parameters in the set are within a specified statistical range among one or more statistical ranges. The set may include one or more statistical quantities. Each statistical quantity among the one or more statistical quantities may be representative of droplet parameters calculated across the multiple droplets. If one or more droplet parameters in the set are outside one or more ranges, then the droplets do not meet criteria and the imprinting process is aborted. If one of the one or more statistical quantities are outside one or more statistical ranges, then the imprinting process is aborted, prior to the template being brought into contact with the plurality of droplets.

In an embodiment, a diameter element among the droplet parameters in the set is an estimated average diameter of the particular droplet. The average diameter of the particular droplet may be estimated by any of a variety of well-known methods used in image analysis for identifying edges, circles, and calculating the dimensions based on those images. Crude image analysis techniques, such as thresholding and pixel counting may also be in an embodiment, where the location and shape of the droplets have low variation even when the substrate coating 140 is missing or malformed. The criteria check step S214 may include calculating a diameter element, or another droplet parameter, based on the image obtained in step S212. The criteria check step S214 may also include calculating diameter elements, or other droplet parameters, of multiple droplets based on the image obtained in step S212.

The criteria check step S214 may also include comparing the diameter element to a diameter range. The diameter range may be a range among the one or more ranges that are used in the criteria checking. The diameter range may have a lower bound that is 75% of an expected diameter of the particular droplet. In an embodiment the diameter range has no upper bound. The applicant has found that an embodiment may include no upper bound on the diameter because a larger than expected droplet may impact the imprinting process, but does not reflect any underlying issues that would cause damage to the template thus requiring the imprinting process to abort.

In an embodiment, during step S214 the processor 132 may estimate the expected diameter based on a predicted volume of the particular droplet dispensed onto the substrate and a period of time between the particular droplet being dispensed onto the substrate 102 and when the image of particular droplet is obtained. The fluid dispenser 122 may be configured to dispense droplets with a specified predicted volume. The volume may be predicted based on the current, waveform, and/or voltage applied to the fluid dispenser. The droplets may have all the same volume or may have a variety of droplet volumes. After the droplets land on the substrate, the rate at which the droplets spread is a function of the wetting angle between the formable material 124 and the surface on which the droplet has landed. By carefully controlling the time at which an image of the particular droplet is imaged after it has landed on the substrate, the quality of the coating 140 under the droplet can also be determined. The expected diameter may also be a measured value. In an embodiment, during step S214 the processor 132 may estimate the expected diameter of each droplet among multiple droplets based on a predicted volume of each of the droplets dispensed onto the substrate and a period of time between each of the droplets being dispensed onto the substrate and when the image of particular droplet is obtained.

In an embodiment, during criteria check step S214 the processor 132 may form a plurality of droplet diameter deviations. A droplet diameter deviation for the each droplet among the multiple droplets may be based on a difference between the expected diameter for the each droplet and the diameter element for the each droplet. The processor 132 may also determine a statistical quantity of the plurality of droplet diameter deviations. The statistical quantity may be an average, median, standard deviation or a higher order statistical quantity. In an embodiment, the criteria check step S214 may include checking if the statistical quantity is within a statistical range. In an embodiment, in which the statistical quantity is the average or the median of the plurality of droplet diameter deviations, the statistical range has a lower bound of 75% of an average expected diameter and has no upper bound. In an embodiment, in which the statistical quantity is the standard deviation of the plurality of droplet deviations, the statistical range is 25%.

In an embodiment, during criteria check step S214 the processor 132 may form a plurality of droplet diameter standard deviations by estimating a droplet diameter standard deviation for the each droplet among the multiple droplets based on a difference between the expected diameter of each droplet and the droplet diameter element for the each droplet among the multiple droplets and the difference divided by the expected diameter of each droplet among the multiple droplets. The statistical quantity may be one of an average, median, standard deviation, or a higher order statistical quantity of the plurality of droplet diameter standard deviations. In an embodiment, the criteria check step S214 may include checking if the statistical quantity is within a statistical range of ±0.25.

In an embodiment, during criteria check step S214 the processor 132 may represent a particular physical characteristic of a particular droplet among multiple droplets by a particular droplet parameter in the set. In an embodiment, a particular droplet parameter may be a diameter difference between an estimated average droplet diameter of the particular droplet and an expected droplet diameter of the particular droplet. In an embodiment, a particular droplet parameter may be a general absolute position difference between an estimated general coordinate position of the particular droplet and an expected general coordinate position of the particular droplet. In an embodiment, a particular droplet parameter may be a first coordinate position difference between an estimated first coordinate position of the particular droplet along a first axis and an expected first coordinate position of the particular droplet along the first axis. In an embodiment, a particular droplet parameter may be a second coordinate position difference between an estimated second coordinate position of the particular droplet along a second axis and an expected second coordinate position of the particular droplet along the second axis, wherein the second axis is perpendicular to the first axis. In an embodiment, a particular droplet parameter may be a radius difference between an estimated radius of the particular droplet and a predicted radius of the particular droplet. In an embodiment, a particular droplet parameter may be an eccentricity difference between an estimated eccentricity of the particular droplet and a predicted eccentricity of the particular droplet. In an embodiment, a particular droplet parameter may be a roundness difference between an estimated roundness of the particular droplet and a predicted roundness of the particular droplet. In an embodiment, a particular droplet parameter may be a compactness difference between an estimated compactness of the particular droplet and a predicted compactness of the particular droplet. In an embodiment, a particular droplet parameter may be a circumference difference between an estimated circumference of the particular droplet and a predicted circumference of the particular droplet. In an embodiment, a particular droplet parameter may be an area difference between an estimated area of the particular droplet and a predicted area of the particular droplet. In an embodiment, a particular droplet parameter may be an isoperimetric ratio difference between an estimated isoperimetric ratio of the particular droplet as estimated by the square of the estimated circumference of the particular droplet divided by the estimated area of the particular droplet, and a predicted isoperimetric ratio of the particular droplet.

Aborting the imprinting process may include preventing the patterning surface 112 from contacting the formable material. Aborting the imprinting process may include notifying an operator that there is an issue with a substrate. Aborting the imprinting process may include removing the substrate 102 from the substrate chuck and restarting the imprinting process at step S206 with a new substrate 102.

If all of the one or more droplet parameters in the set meet the criteria as determined by step S214, only then is contacting step S216 initiated; the processor 132 may cause one or both of the substrate positioning stage 106 and a template positioning stage to bring the patterning surface 112 of the template 108 into contact with the formable material 124 in imprinting field i, thus performing the imprinting process with the template. In an embodiment, if all of the one or more statistical quantities are inside the one or more statistical ranges, as determined by S214, then the imprinting process continues and the contacting step S216 is initiated. In an embodiment, the droplet information (image) is obtained prior to the template 108 and the substrate 102 moving towards each other. In an embodiment, the image is obtained while the template 108 and the particular droplet of formable material 124 are moving relative to each other in a direction that includes moving in a direction parallel with the substrate 102. In an embodiment, the droplet information is an image obtained by an imaging device that obtains light from the particular droplet of formable material 124 prior to the template 108 being brought into superposition with the plurality of droplets of formable material 124.

During a spreading step S218, the formable material 124 then spreads out towards the edge of the imprinting field i. The edge of the imprinting field i may be defined by the edges of the mesa 110 of the template 108. How the formable material 124 spreads and fills the mesa 110 can be observed via the spread camera 136. At a specified time after contacting step S216 or after formable material 124 has spread to a specified extent in spreading step S218, the processor 132 causes the energy source 126 to irradiate the formable material 124 with actinic radiation, in curing step S220, so as to cure (polymerize) the formable material 124. In a separation step S222, the processor 132 uses one or both of the substrate positioning stage 106 and a template positioning stage to separate the patterning surface 112 of the template 108 from the cured formable material on the substrate 102. A pattern is thus formed on the substrate by contacting the template with the formable material on the substrate.

In an index checking step S224, the processor 132 checks if the index i is equal to N. If the index i is not N then the process 200 moves onto an incrementing step S226 in which the index i is incremented and the process 200 moves back to positioning step S208. If the index i is N then the imprinting process 200 stops. In one embodiment, additional processing is performed on the substrate 102 in a processing step S228 so as to create an article of manufacture (semiconductor device). In an embodiment, each imprinting field includes a plurality of devices.

In an alternative embodiment, steps S212 and S214 are only performed if the index i is 1, after or while droplets are dispensed onto the first imprinting field. For example, for a substrate 102 that includes a plurality of imprinting fields. Droplet information about one imprinting field among the plurality of imprinting fields is acquired prior to any imprinting field among the plurality of imprinting fields is imprinted. Then droplet information about the plurality of imprinting fields other than the one imprinting field is not acquired during the rest of the imprinting process.

The further processing in processing step S228 may include etching processes to transfer a relief image into the substrate 102 that corresponds to the pattern in the patterned layer. The further processing in processing step S228 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Droplet Information

Figure 3A:
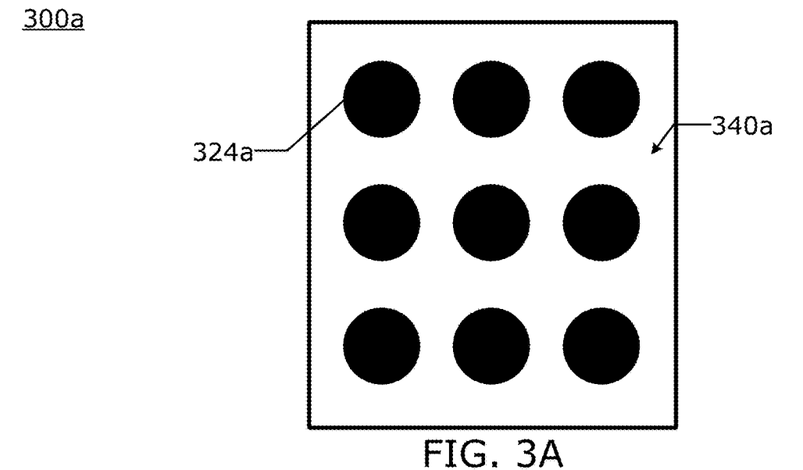
FIGS. 3A-C are illustrations of droplet information that may be used in an embodiment.
Figure 3B:
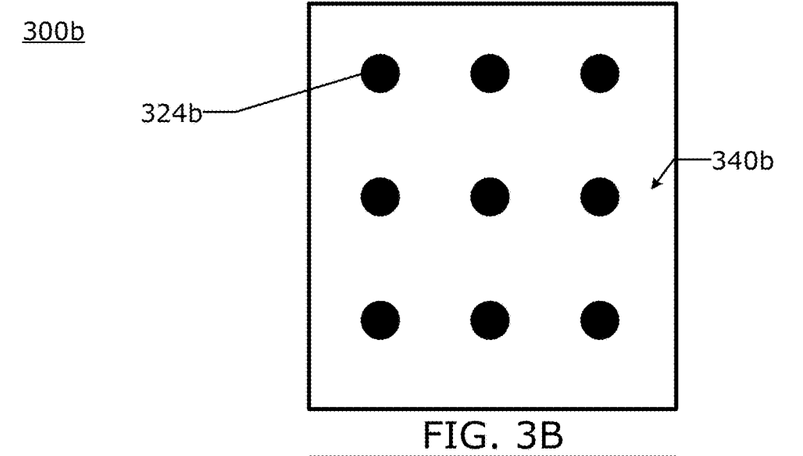
Figure 3C:
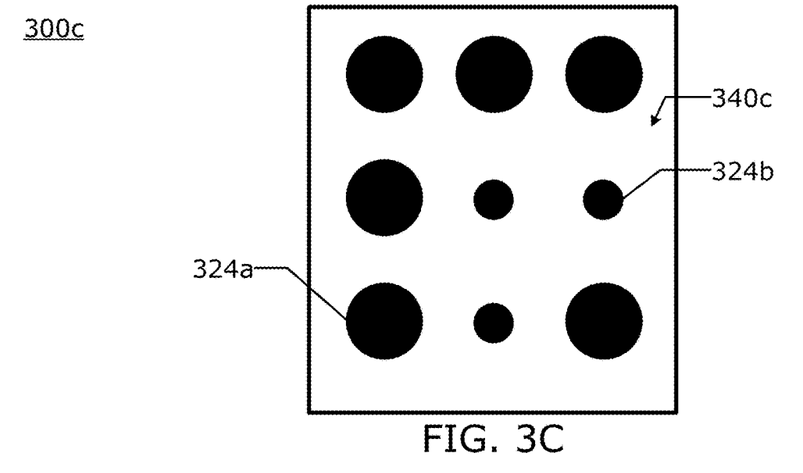

FIG. 3A is an illustration of exemplary droplet information 300a, which in this example is an image of 9 droplets 324a of formable material 124 on a substrate 120 with a coating 340a showing the diameter of dispensed drops on a properly coated surface 340a. FIG. 3B is an illustration of exemplary droplet information 300b, which in this example is an image of 9 droplets 324b which include the same volume of formable material but were deposited on a surface 340b of the substrate 102 without a coating 140. FIG. 3C is an illustration of exemplary droplet information 300c, which in this example is an image of 6 normal droplets 324a and 3 undersized droplets 324b which include the same volume of formable material but were deposited on a substrate 102 with a non-uniform (malformed) coating 340c.

Figure 4A:
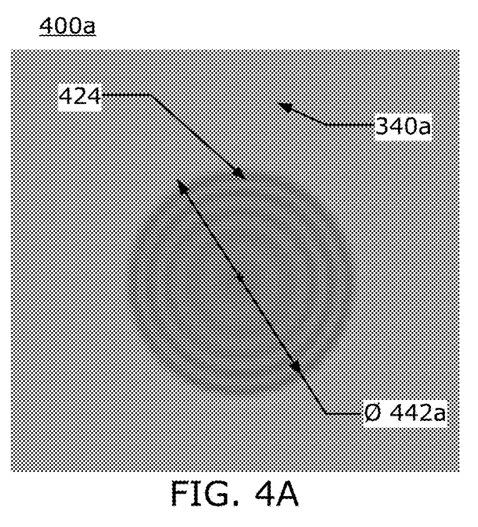
FIGS. 4A-D are illustrations of droplet information that may be used in an embodiment.
Figure 4B:
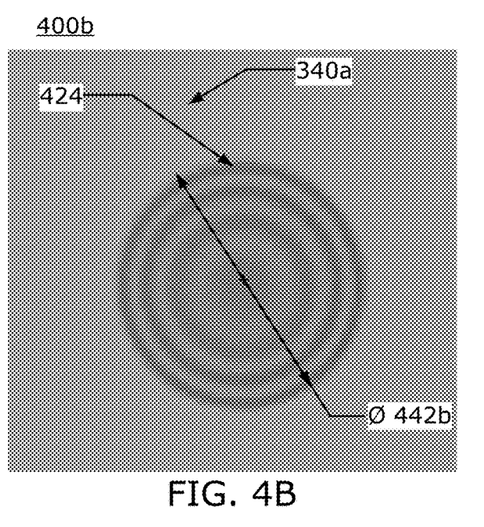
Figure 4C:
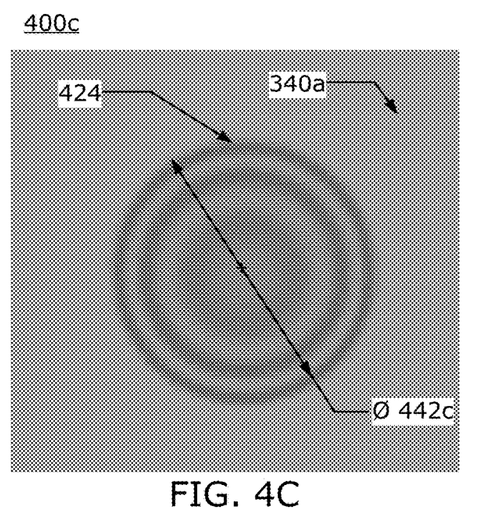
Figure 4D:
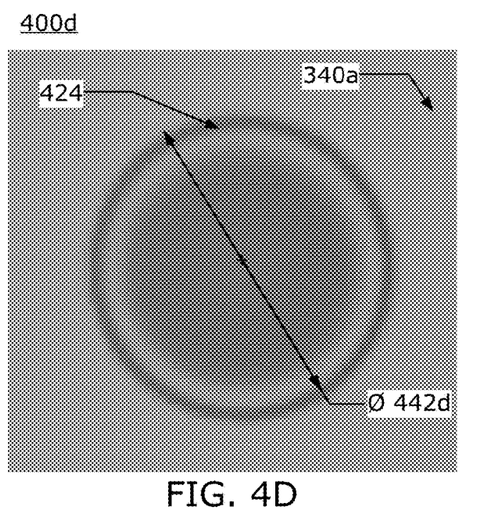

FIG. 4A is an illustration of exemplary droplet information 400a which in this example is an image of a single droplet 424 on the properly coated surface 340a. The droplet information image 400a was obtained 500 ms after the droplet was deposited onto the properly coated surface 340a. The droplet diameter parameter 442a of the droplet 424 can be estimated, using standard image analysis to obtain, which at 500 ms is 104 µm. FIG. 4B is an illustration of exemplary droplet information 400b of that same exemplary droplet 424 after 750 ms and having a new droplet diameter parameter 442b of 115 µm. FIG. 4C is an illustration of exemplary droplet information 400c of that same exemplary droplet 424 after 1000 ms and having a new droplet diameter parameter 442c of 121 µm. FIG. 4D is an illustration of exemplary droplet information 400d of that same exemplary droplet 424 after 2000 ms and having a new droplet diameter parameter 442d of 140 µm.

The droplet information images 400a-d also show interference fringes (Newton's rings). The number of fringes of the Newton's ring is determined by the wavelength of observing light and the shape of a drop. It is possible to estimate the volume of the drop based the number of fringes of the Newton's ring and the diameter of the drop as described in US patent publication 2015/0360400-A1 which is hereby incorporated by reference.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A process of controlling an imprinting process comprising:
    dispensing a plurality of droplets onto a substrate;
    acquiring droplet information that is representative of one or more particular droplets among the plurality of droplets;
    estimating a set that includes one or more droplet parameters of the one or more particular droplets based on the droplet information;
    wherein each of the one or more droplet parameters in the set is representative of a single droplet among the one or more particular droplets;
    prior to a template being brought into contact with the plurality of droplets, determining, whether any of the set are outside one or more ranges, or all of the set are inside the one or more ranges;
    in a first case when any of the set are outside one or more ranges, then the imprinting process is aborted prior to the template being brought into contact with the plurality of droplets; and
    in a second case when all of the set are inside the one or more ranges, then the imprinting process is performed with the template.

2. The process according to claim 1, wherein the droplet information is an image of the single particular droplet among the one or more particular droplets on the substrate prior.

3. The process according to claim 2, wherein:
    the one or more the droplet parameters includes a diameter element that is an estimated average diameter of the single particular droplet;
    the one or more ranges include a diameter range that has a lower bound of 75% of an expected diameter of the single particular droplet and has no upper bound;
    the expected diameter is estimated based on:
        a predicted volume of the single particular droplet dispensed onto the substrate; and
        a period of time between the single particular droplet being dispensed onto the substrate and when the image of the single particular droplet is obtained.

4. The process according to claim 1, wherein the droplet information is an image representative of multiple droplets among the plurality of droplets.

5. The process according to claim 4, wherein:
    the set also includes one or more statistical quantities;
    each statistical quantity among the one or more statistical quantities is representative of a statistical characteristic of the multiple droplets that is calculated based on the droplet parameters in the set; and
    the one or more ranges are one or more statistical ranges.

6. The process according to claim 5, wherein:
    the each droplet parameter includes a diameter element that is representative of an estimated average diameter of each droplet among the multiple droplets;
    the each droplet among the multiple droplets has an expected diameter that is estimated based on:
        a predicted volume of the each droplet dispensed onto the substrate; and
        a period of time between the each droplet being dispensed onto the substrate and when the image of the each droplet is obtained.

7. The process according to claim 6, wherein:
    the one or more droplet parameters include a plurality of droplet diameter deviations;
    each droplet diameter deviation among the plurality of droplet diameter deviations is a difference between the expected diameter for the each droplet and the diameter element for the each droplet;
    the statistical quantity is one of an average or median of the plurality of droplet diameter deviations; and
    the statistical range has a lower bound of 75% of an average expected diameter and has no upper bound.

8. The process according to claim 6, wherein:
    the one or more droplet parameters include a plurality of droplet diameter standard deviations;
    each droplet diameter standard deviation among the plurality of droplet diameter standard deviations is a difference between the expected diameter of each droplet and the droplet diameter element for the each droplet and the difference divided by the expected diameter of each droplet;
    the statistical quantity is one of an average, median, or standard deviation of the plurality of droplet diameter standard deviations; and
    the statistical range is ±0.25.

9. The process according to claim 6, wherein:
    the one or more droplet parameters include a plurality of droplet diameter deviations;
    each droplet diameter deviation among the plurality of droplet diameter deviations is a difference between the expected diameter for the each droplet and the diameter element for the each droplet;
    the statistical quantity is a standard deviation of the plurality of droplet deviations; and
    the statistical range is 25%.

10. The process according to claim 1, wherein:
    the substrate includes a plurality of imprinting fields; and
    droplet information about each imprinting field is acquired prior to each imprinting field being imprinted.

11. The process according to claim 1, wherein the droplet information is one of:
    a first average intensity of light reflected from a first region where multiple droplets are deposited on the substrate;
    a first contrast ratio of the light reflected from the first region where the multiple droplets are deposited on the substrate;
    a second average intensity of light reflected from a second region where the particular droplet is deposited on the substrate;
    a second contrast ratio of the light reflected from the second region where the particular droplet is deposited on the substrate; and
    a plurality of pixels, wherein each pixel among the plurality of pixels represents a portion of the light reflected from the region where the particular droplet is deposited on the substrate.

12. The process according to claim 1, wherein the each of the one or more droplet parameters of the particular droplet is representative of:
- an estimated length of a first chord passing through a predicted center of the particular droplet along a first direction;
- an estimated length of a second chord passing through an estimated center of the droplet in the first direction;
- an estimated length of a third chord passing connecting two points on an estimated edges of the particular droplet;
- an estimated diameter of the particular droplet;
- an estimated radius of the particular droplet;
- an estimated eccentricity of the particular droplet;
- an estimated roundness of the particular droplet;
- an estimated compactness of the particular droplet;
- an estimated circumference of the particular droplet;
- an estimated are of the particular droplet; or
- an isoperimetric ratio of the particular droplet as estimated by the square of the estimated circumference of the particular droplet divided by the estimated area of the particular droplet.

13. The process according to claim 1, wherein:
the substrate includes a plurality of imprinting fields;
droplet information about one imprinting field among the plurality of imprinting fields is acquired prior to imprinting any of the plurality of imprinting fields; and
droplet information about the plurality of imprinting fields other than the one imprinting field is not acquired.

14. The process according to claim 1, wherein a particular physical characteristic of the particular droplet that is represented by a particular droplet parameter among the one or more droplet parameters is selected from:
- a diameter difference between an estimated average droplet diameter of the particular droplet and an expected droplet diameter of the particular droplet;
- a general absolute position difference between an estimated general coordinate position of the particular droplet and an expected general coordinate position of the particular droplet;
- a first coordinate position difference between an estimated first coordinate position of the particular droplet along a first axis and an expected first coordinate position of the particular droplet along the first axis;
- a second coordinate position difference between an estimated second coordinate position of the particular droplet along a second axis and an expected second coordinate position of the particular droplet along the second axis, wherein the second axis is perpendicular to the first axis;
- a radius difference between an estimated radius of the particular droplet and a predicted radius of the particular droplet;
- an eccentricity difference between an estimated eccentricity of the particular droplet and a predicted eccentricity of the particular droplet;
- a roundness difference between an estimated roundness of the particular droplet and a predicted roundness of the particular droplet;
- a compactness difference between an estimated compactness of the particular droplet and a predicted compactness of the particular droplet;
- a circumference difference between an estimated circumference of the particular droplet and a predicted circumference of the particular droplet;
- an area difference between an estimated area of the particular droplet and a predicted area of the particular droplet; and
- an isoperimetric ratio difference between an estimated isoperimetric ratio of the particular droplet as estimated by the square of the estimated circumference of the particular droplet divided by the estimated area of the particular droplet, and a predicted isoperimetric ratio of the particular droplet.

15. The process according to claim 1, wherein the droplet information is an image obtained by an imaging device that obtains light from the particular droplet that has passed through the template prior to the template being brought into contact with the plurality of droplets.

16. The process according to claim 15, wherein the image is obtained prior to the template and the substrate moving towards each other.

17. The process according to claim 16, wherein the image is obtained while the template and the particular droplet are moving relative to each other in a direction that includes moving in a direction parallel with the substrate.

18. The process according to claim 1, wherein the droplet information is an image obtained by an imaging device that obtains light from the particular droplet prior to the template being brought into superposition with the plurality of droplets.

19. An imprinting apparatus that forms a pattern on a substrate using a template comprising:
- a substrate holder configured to hold the substrate;
- a dispenser configured to dispense a plurality of droplets onto the substrate;
- an imaging system configured to acquire droplet information that is representative of one or more particular droplets among the plurality of droplets;
- a processor configured to estimate a set that includes one or more droplet parameters of the one or more particular droplets based on the droplet information;
- wherein each of the one or more droplet parameters in the set is representative of a single droplet among the one or more particular droplets;
- the processor is further configured to, prior to a template being brought into contact with the plurality of droplets, determining, whether any of the set are outside one or more ranges, or all of the set are inside the one or more ranges;
- in a first case when any of the set are outside one or more ranges, then the processor is configured to send instructions to abort an imprinting process prior to the template being brought into contact with the plurality of droplets; and
- in a second case when all of the set are inside the one or more ranges, then the processor sends instructions to perform the imprinting process with the template.

20. A method of manufacturing an article, comprising the steps of:
- dispensing a plurality of droplets formable material onto a substrate;
- acquiring droplet information that is representative of one or more particular droplets among the plurality of droplets;
- estimating a set that includes one or more droplet parameters of the one or more particular droplets based on the droplet information;
- wherein each of the one or more droplet parameters in the set is representative of a single droplet among the one or more particular droplets;

prior to a template being brought into contact with the plurality of droplets, determining, whether any of the set are outside one or more ranges, or all of the set are inside the one or more ranges;

in a first case when any of the set are outside one or more ranges, then an imprinting process is aborted prior to the template being brought into contact with the plurality of droplets;

in a second case when all of the set are inside the one or more ranges, then the imprinting process is performed by contacting the formable material on the substrate with the template forming a pattern in the formable material on the substrate; and processing the substrate on which the pattern has been formed, wherein the article is manufactured from the processed substrate.

* * * * *